US006987258B2

(12) United States Patent
Mates

(10) Patent No.: US 6,987,258 B2
(45) Date of Patent: Jan. 17, 2006

(54) INTEGRATED CIRCUIT-BASED COMPOUND EYE IMAGE SENSOR USING A LIGHT PIPE BUNDLE

(75) Inventor: John W. Mates, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 125 days.

(21) Appl. No.: 10/028,455

(22) Filed: Dec. 19, 2001

(65) Prior Publication Data

US 2003/0111593 A1 Jun. 19, 2003

(51) Int. Cl.
    *H01L 27/00* (2006.01)
(52) U.S. Cl. .............................. 250/208.1; 250/227.11
(58) Field of Classification Search ............... 250/216, 250/208.1, 206–206.3, 234, 208.2, 227.11
    See application file for complete search history.

(56) References Cited

U.S. PATENT DOCUMENTS

| 5,517,019 | A | * | 5/1996 | Lopez ..................... 250/208.1 |
| 5,726,443 | A | * | 3/1998 | Immega et al. .......... 250/227.2 |
| 5,929,440 | A | * | 7/1999 | Fisher ..................... 250/338.1 |
| 6,057,538 | A | * | 5/2000 | Clarke ..................... 250/208.1 |
| 6,075,240 | A | * | 6/2000 | Watanabe et al. ........... 250/234 |
| 6,150,653 | A | | 11/2000 | Assadi et al. |
| 6,194,704 | B1 | | 2/2001 | Assadi et al. |
| 6,320,174 | B1 | * | 11/2001 | Tafas et al. .............. 250/208.1 |
| 2002/0096629 | A1 | * | 7/2002 | Korein ................... 250/227.11 |

OTHER PUBLICATIONS

Hoshino et al., "A one-chip scanning retina with an integrated micro-mechanical scanning actuator for a compound eye visual sensor", Jan. 2000, MEMS 2000, pp. 721-726.*

Croutxe-Barghorn, C. et al., "Fabrication of Refractive Microlens Arrays by Visible Irradiation of Acrylic Monomers: Influence of Photonic Parameters," European Physical Journal Applied Physics, No. 13, pp. 31-37, Jan. 2001 (abstract only). Located at http://www.edpsciences.org/articles/epjap/abs/2001/01/ap0122/ap0122.html.

Grotta, S.W., "Anatomy of a Digital Camera: Image Sensors," Extreme Tech, Jun. 12, 2001. Located at http://www.extremetech.com/print_article/0,3428,a%253D2036, 00.asp.

Liu, S.C., "Silicon Retina with Adaptive Filtering Properties," Advances in Neural Information Processing Systems, vol. 10, Eds. Jordan, M.I., Kearns, M.J., and Solla, S.A., MIT Press, pp. 712-718, 1998. Located at http://www.ini.unizh.ch/~shih/papers.html/.

(Continued)

*Primary Examiner*—Thanh X. Luu
(74) *Attorney, Agent, or Firm*—Cynthia T. Faatz

(57) ABSTRACT

An integrated circuit-based compound eye includes a plurality of photodetector elements disposed on a semiconductor substrate. A compound light directing member includes a light pipe bundle wherein at least some of the light pipes are to individually direct light energy from one or more sources onto one or more of the photodetector elements. The compound light directing member is the primary mechanism to direct light energy onto the one or more of the photodetector elements. Outputs of the photodetector elements are electrically coupled in such a way that an image associated with the source may be synthesized at output circuitry.

For another aspect, a compound exposure determining member includes a plurality of light scanning elements, each of the light scanning elements including an integrated photodetector. Each of the light scanning elements is controllable to vary an angle of the photodetector with respect to a substrate to determine from which point sources and angles light energy is received at the photodetector.

7 Claims, 12 Drawing Sheets

OTHER PUBLICATIONS

Moini, A. et al., "A Biologically Motivated Imager and Motion Detector With Pixel Level Image Processing," Australian Microelectronics Conference, Sep. 29-Nov. 3, 1997.

Moini, A. et al., "Moini et al.'s Insect Vision-Based Motion Detection Chip," School of Electrical and Electronic Engineering, University of Adelaide, Mar. 1997. Located at http://www.eleceng.adelaide.edu.au/Groups/Bugeye/visionchips/vision_chips/ moini_bugeye1.html.

Moini, A. et al., "Moini et al.'s Second Insect Vision-Based Motion Detection Chip," School of Electrical and Electronic Engineering, University of Adelaide, Mar. 1997. Located at http://www.eleceng.adelaide.edu.au/Groups/Bugeye/visionchips/vision_chips/ moini_bugeye2.html.

Moini, A. et al., "Mead's Adaptive Retina," School of Electrical and Electronic Engineering, University of Adelaide, Mar. 1997. Located at http://www.eleceng.adelaide.edu.au/Groups/Bugeye/visionchips/vision_chips/mead_retina.html#SECTION00430000000000000000.

Moini, A. et al., "Moini et al.'s Shunting Inhibition Vision Chip," School of Electrical and Electronic Engineering, University of Adelaide, Mar. 1997. Located at http://www.eleceng.adelaide.edu.ad/Groups/Bugeye/visionchips/vision_chips/moini_si.html#SECTION00527000000000000000.

Hamanaka, K. et al., "An Artificial Compound Eye Using a Microlens Array and Its Application to Scale-Invariant Processing," Optical Review, vol. 3, No. 4, pp. 264-268, 1996 (abstract only). Located at http://annex.jsap.or.jp/OSJ/opticalreview/TOC-Lists/vol03/3d264tx.html.

"Omniviews: Omni-directional Visual System," Center for Machine Perception, Czech Technical University, project description, Part B—FET Open Short Proposals, May 14, 2000. Located at http://cmp.felk.cvut.cz/projects/omniviews/proposal.part.B/.

Lichtensteiger, L., "Evolving Sensor Morphologies using Adaptive Hardware," Department of Informatics, University of Zurich, Oct. 11, 2000. Located at http://www.ifi.unizh.ch/ailab/projects/eyebot/.

Eastman Kodak Company, "Solid State Image Sensors Terminology," Application Note, Rev. 0, p. 26, Dec. 8, 1994.

Chanan, G. et al., "Design Issues for the Active Control System of the California Extremely Large Telescope," Mar. 31, 2000. Located at http://celt.ucolick.org/reports/report00_7.pdf#searchx'design%20issues%20for%20the%20active%20control%20system%20of%20the%20California%20Extremely%20large%20telescope'.

Huang, L.-S., "MEMS Packaging for Micro Mirror Switches", Proceedings 48th Electronic Components & Technology Conference, Seattle WA, pp. 592-597, May 1998.

Larson, S., "New Camera Technology: Eyes from Eyes," Center for Automation Reserch, University of Maryland, Apr. 18, 1999. Located at http://www.cfar.umd.edu/~larson/dialogue/newCameraTech.html.

"Fovealed Silicon Retina," Computational Sensory-Motor Systems Lab, John Hopkins University, project description, Jun. 2000. Located at http://etienne.ece.jhu.edu/projects/visionchip2/.

Bains, S., "Retinal Scanner Works Without Adaptive Optics," Laser Focus World, Feb. 1, 2001.

Bains, S., "Optics Expands Into Tiny Displays", SPIE Web, OE Reports, Jun. 1997. Located at http://www.spie.org/web/oer/june/jun97/light.html.

Mahowald, M. et al., "The Silicon Retina," Scientific American, pp. 76-82, May 1991. Located at http://www.ini.unizh.ch/projects/SiRetina_SA/.

Hoshino, K. et al., "Design and Performance of a Micro-Sized Biomorphic Compound Eye with a Scanning Retina," Journal of Microelectromechanical Systems, vol. 9, No. 1, pp. 32-37, Mar. 2000.

Vdovin, G. et al., "Technology and Applications of Micromachined Silicon Adaptive Mirrors," Optical Engineering, vol. 36, No. 5, pp. 1382-1390, May 1997.

* cited by examiner

INTEGRATED CIRCUIT-BASED COMPOUND EYE IMAGE SENSOR USING A LIGHT PIPE BUNDLE

BACKGROUND

1. Field

An embodiment of the present invention relates to the field of imaging devices and methods and, more particularly, to an integrated circuit-based, artificial compound eye.

2. Discussion of Related Art

The market for image sensing devices is growing rapidly as new applications for such devices continue to arise. Current applications include camcorders, facsimile machines, digital cameras, toys and personal computer (PC) cameras, for example. Cameras and/or other types of image sensing devices are also expected to soon be included in items such as cars, wireless telephones, and personal digital assistants, for example.

For many applications, there is a drive to continue to make components, including image sensing components, smaller. In some cases, however, currently available technology limits the extent to which these devices may be scaled. Current cameras, such as PC cameras, for example, typically include a single lens to focus light energy onto photosensitive circuitry. Such single lens systems do not scale well to small sizes and weights, however, due to issues such as lens curvature and focal length, for example, and thus, their utility may be limited for current and/or future applications where very small and/or lightweight image sensing components are desired.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A method and apparatus for image sensing using an integrated circuit-based compound eye is described. In the following description, particular types of integrated circuits, lens configurations and materials, for example are described for purposes of illustration. It will be appreciated, however, that other embodiments are applicable to other types of integrated circuits, and to light directing elements and/or image sensors configured in another manner.

Figure 1:
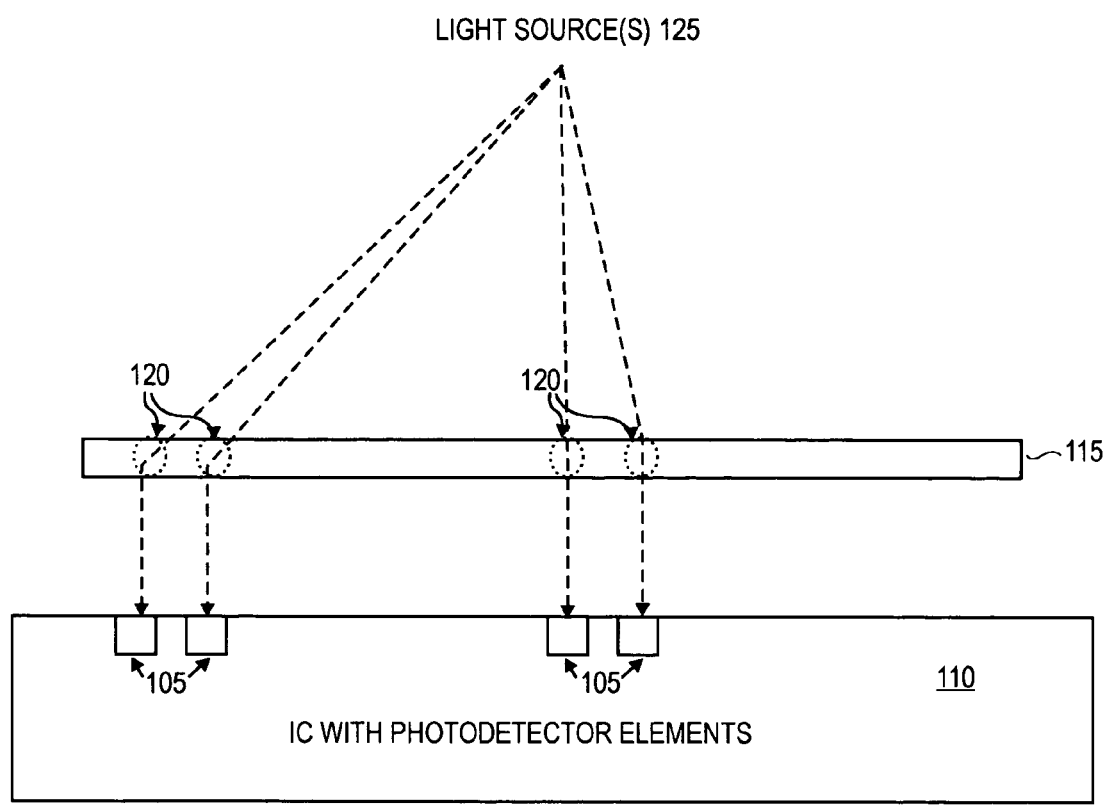
FIG. 1 illustrates a cross-sectional view of an integrated circuit-based compound eye of one embodiment.

For one embodiment, referring to FIG. 1, an apparatus comprises a plurality of photodetector elements 105 (also referred to herein as pixels, light receptor, photoreceptor and/or optoelectronic elements) disposed on a substrate 110, such as a semiconductor substrate. The apparatus also includes a light directing member 115, also referred to herein as an exposure determining member, including a plurality of light directing elements 120 (only a few of which are indicated in FIG. 1).

For this embodiment, at least some of the light directing elements are provided to individually direct light energy from one or more sources 125 onto one or more of the photodetector elements 105. The light directing member 115 provides the primary light directing means to direct light energy onto the photodetector elements 105, i.e. there are no other lenses or light directing members provided between the light source(s) 125 and the light directing member 115. The photodetectors 105 are electrically coupled together such that an image corresponding with the source 125 may be synthesized at output circuitry.

For one embodiment, the light directing member 115 includes an array of lenslets, also referred to as a microlens array. For another embodiment, the light directing member 115 includes a plurality of light pipes bundled together. For still another embodiment, the light directing member 115 includes micromachined elements that are movable to determine the direction from which photons are provided to underlying photodetector elements.

In accordance with an alternative embodiment, the exposure determining members are micromachined light scanning elements that each include a photodetector element. The micromachined light scanning elements are provided on a single substrate and controlled by a micromachine control circuit to direct at least some of the micromachined scanning elements to receive light from one or more sources.

Details of these and other embodiments are provided in the following description.

Figure 2:
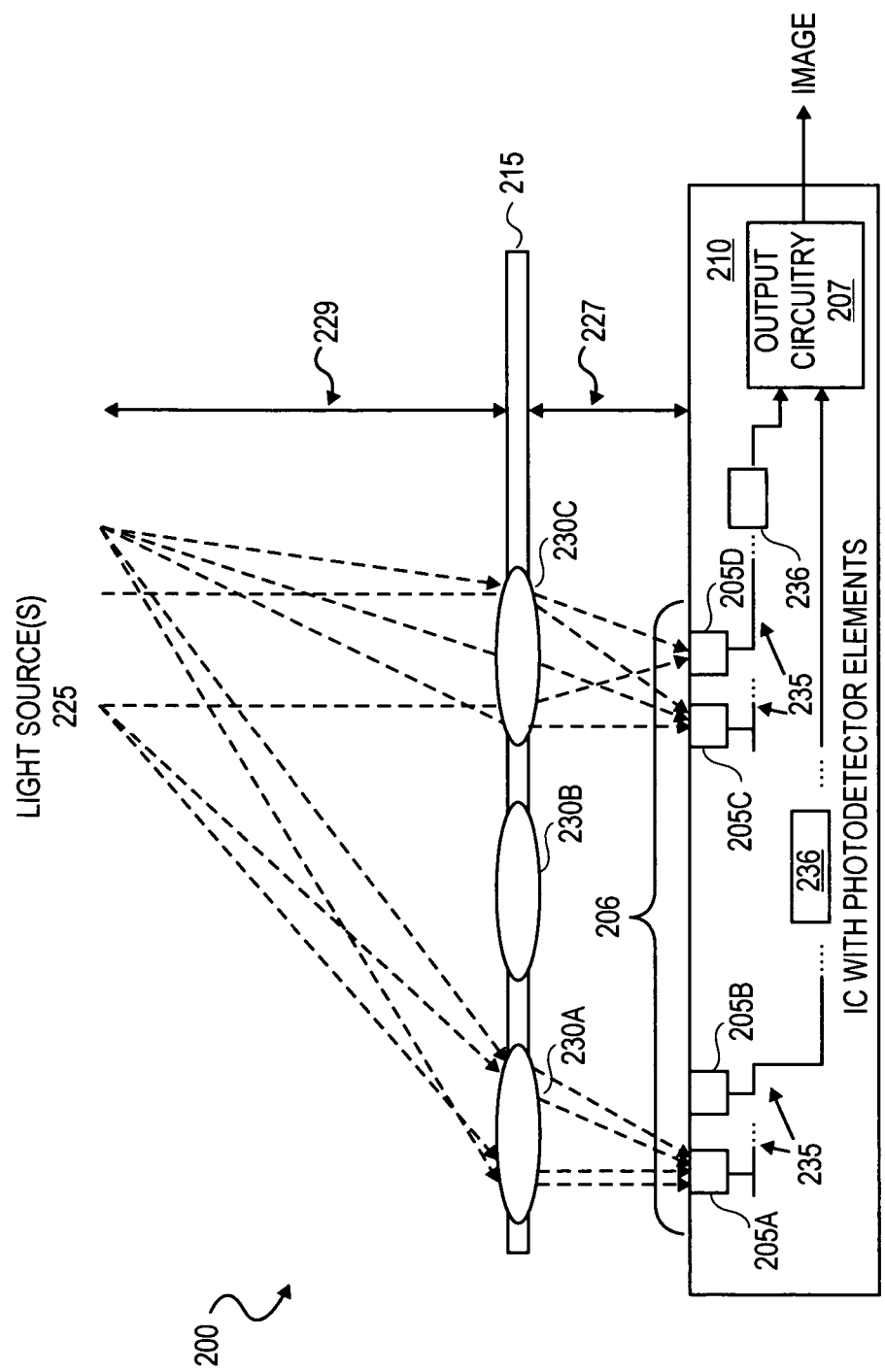
FIG. 2 illustrates a cross-sectional view of an exemplary integrated circuit-based compound eye of one embodiment including a microlens array.

Referring to FIG. 2, a high level cross-sectional diagram of an integrated circuit-based compound eye 200 of one embodiment is shown. The artificial compound eye 200 includes a plurality of photodetector elements 205 provided on a semiconductor or other type of substrate 210 that may be part of, for example, an integrated circuit (IC) device. While only four representative photodetector elements 205a–d are shown in FIG. 2, it will be appreciated that the number of photodetector elements 205 on the IC 210 may be much larger.

The photodetector elements 205 (also referred to as optoelectronic elements) may be arranged, for example, in a two-dimensional, regular or irregular array to provide a photosensitive region 206 on the IC 210.

For one embodiment, the photodetector elements 205 are complementary metal oxide semiconductor-based (CMOS-based) photodetector elements. For another embodiment, charge-coupled devices (CCDs) may be used to provide the photodetector elements 205. For still another embodiment, mixed CMOS/CCD technology may be used to provide the photodetector elements 205. Other types of photodetector elements are within the scope of various embodiments.

Each of the photodetector elements 205 is responsive to incident photons from a light source, such as the light source 225, to provide an electrical signal indicative of the energy or intensity of the light spectrum to which it is sensitive. Other circuitry (not shown) either on the IC 210 or coupled to the IC 210 may then convert the electrical signal in a manner well-known to those of ordinary skill in the art to provide an associated digital signal.

Figure 3:
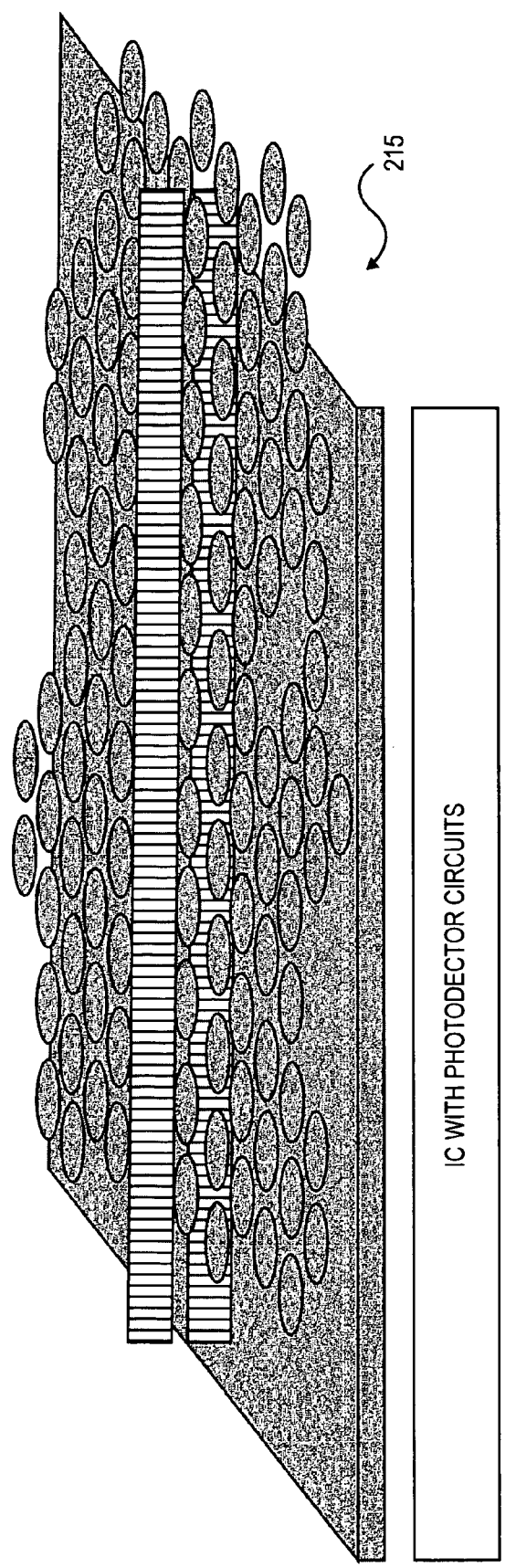
FIG. 3 illustrates a perspective view of the light directing member of the integrated circuit-based compound eye of FIG. 2.

For the artificial compound eye 200 of FIG. 2, a light directing member 215 is disposed between a light source 225 and the photodetectors 205. The light directing member 215 for the embodiment of FIG. 2 is a compound light directing member that includes a lenslet array (also referred to as a microlens or microlenticular array) as shown in perspective view in FIG. 3. With continuing reference to FIG. 2, the light directing member 215 is referred to as a compound light directing member because the lenslet array 215 includes a plurality of lenslets 230 that are each capable of acting as a light directing element. Exemplary lenslets 230a–c are shown in FIG. 2, but it will be appreciated that the lenslet array 215 may include many more such lenslets, including more lenslets than shown in FIG. 3.

The lenslets 230 may be arranged in any sort of pattern on the light directing member 215. For some embodiments, the arrangement, spacing, sizes, etc. of the lenslets 230 in the lenslet array 215 may depend on considerations such as, for example, the method and/or materials used to manufacture the lenslet array 215, available area, characteristics of the underlying photodetectors 205, the particular application for the compound eye 200, desired characteristics (e.g. resolution, sensitivity, allowable noise, desired dynamic range) of the compound eye 200, etc. Other factors may also be considered.

The lenslet array 215 may be manufactured directly on an integrated circuit (IC) die or other substrate 210 as part of the IC fabrication process. Alternatively, the lenslet array 215 may be manufactured separately from the substrate 210 and then optically coupled with the substrate 210 during a later manufacturing step such as, for example, packaging. For the second case, the lenslet array 215 may be, for example, embossed on a plastic or other type of cover or window (not shown) that is provided adjacent to the IC 210.

There are several different, known manufacturing techniques for suitable lenslet arrays. Some such techniques are provided, for example in a publication entitled, "Fabrication of Refractive Microlens Arrays by Visible Irradiation of Acrylic Monomers: Influence of Photonic Parameters," by C. Croutxé-Barghorn et al., Eur. Phys. J. AP 13, 31–37 (2001), the text of which, at the time of this application, may be found at www.edpsciences.org/articles/epjap/pdf/2001/01/ap0122.pdf. Alternative lenslet array manufacturing techniques and/or materials not mentioned in this publication may also be used to manufacture the lenslet array 215 for various embodiments.

The lenslet array 215 is positioned with respect to the plurality of photodetector elements 205 such that at least some of the lenslets 230 focus light energy from the light source 225 onto one or more of the photodetectors 205. For example, light received at the lenslet 230c may be provided either to photodetector element 205c or to photodetector element 205d depending on the incident angle of the light.

Further, for one embodiment, the distance 227 between the light directing member 215 and a surface of the substrate 210 may be less than or equal to 0.0001 meter, for example, while the distance 229 between the light directing member 215 and the light source of interest 225 may be greater than or equal to 0.1 meter. It will be appreciated that different separations between the light directing member 215 and the light source of interest 225 and/or between the light directing member 215 and the substrate 210 may apply to different embodiments.

With continuing reference to FIG. 2, the multiple lenslets in the lenslet array 215 provide the primary mechanism to focus light from the light source 225 onto the photodetector elements 205. In other words, for this embodiment, there is no additional lens or other type of light directing member provided between the lenslet array 215 and the light source 225. Because the lenslet array 215 is used to focus light onto the photodetector elements 205, mapping an output of each of the photodetector elements 205 to a corresponding point in an output image may not be as straightforward as for a single lens-based image sensor.

For the compound eye 200 of FIG. 2, in order to be able to synthesize an output image that corresponds to the light source 225 or to another image source in response to photons directed onto the photodetector elements 205 by the lenslet array 215, the photodetector elements 205 are interconnected according to a compound eye wiring pattern 235 including image integration circuitry 236, as described in more detail below. In other words, whereas conventional cameras use single large lenses to integrate light from point sources onto points on underlying film or retinas, integration of light energy using the compound eye 200 takes place via the wiring and circuits interconnecting and interpreting outputs of the photodetector elements 205.

Figure 4:
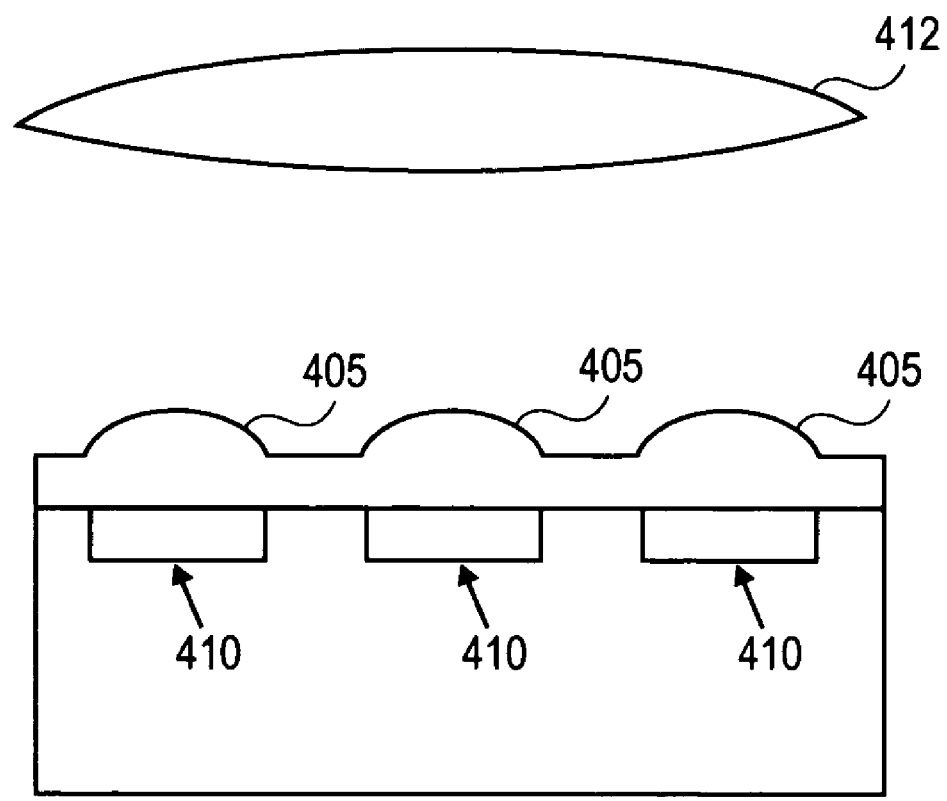
FIG. 4 illustrates a cross-sectional view of a conventional single-lens-based system.

This is in contrast to some conventional applications for microlenses. Referring to FIG. 4, as discussed in, for example, a publication entitled, "Anatomy of a Digital Camera: Image Sensors," by Sally Wiener Grotta, Extreme Tech, Jun. 10, 2001, which can, at the time of filing this application, be found at (http://www.extremetech.com/print article/0,3428,a%253D2036,00.asp). In some currently available digital cameras, for example, microlenses 405 may be grown or otherwise placed above individual CCDs or CMOS sensor devices 410 (only a representative few of each of the microlenses 405 and sensor devices 410 are shown in FIG. 4). These microlenses 405 are used to increase the angular response, and thus, photosensitivity of such sensor devices 410. The microlenses 405, however, receive incident light via a single lens 412 that is situated between a light source 415 and the microlenses 405 as shown in FIG. 4. For such a single lens-based system, it is not necessary or useful to interconnect sensor devices 410 using a compound eye wiring pattern similar to that described above. This is because the physical locations of the sensors 410 more directly correspond to the physical locations of pixels in a resultant image.

While such single lens-based systems may provide a more straightforward relationship between the relative physical location of a sensor and that of a corresponding element of a resultant image, the scalability and other limitations of such single lens-based systems may prevent them from being practical for applications, for example, where very small weight and/or form factors are desired as discussed above.

Referring again to FIG. 2, according to the compound eye wiring pattern 235, photodetectors 205 that are physically adjacent to each other on the substrate 210 may not necessarily provide portions of a captured image that are physically adjacent to each other. For purposes of illustration, reference is made to FIG. 5, which provides an overhead view of exemplary lenslets 230x and 230y in the lenslet array 215 and a plurality of photodetectors 205 underlying each of the lenslets 230x and 230y. For this exemplary embodiment, the sizes of the lenslets 230x and 230y in relation to the photodetectors 205 are such that a single lenslet 230 may overlie (in relation to the light source 225) multiple photodetectors 205 as shown.

Figure 5:
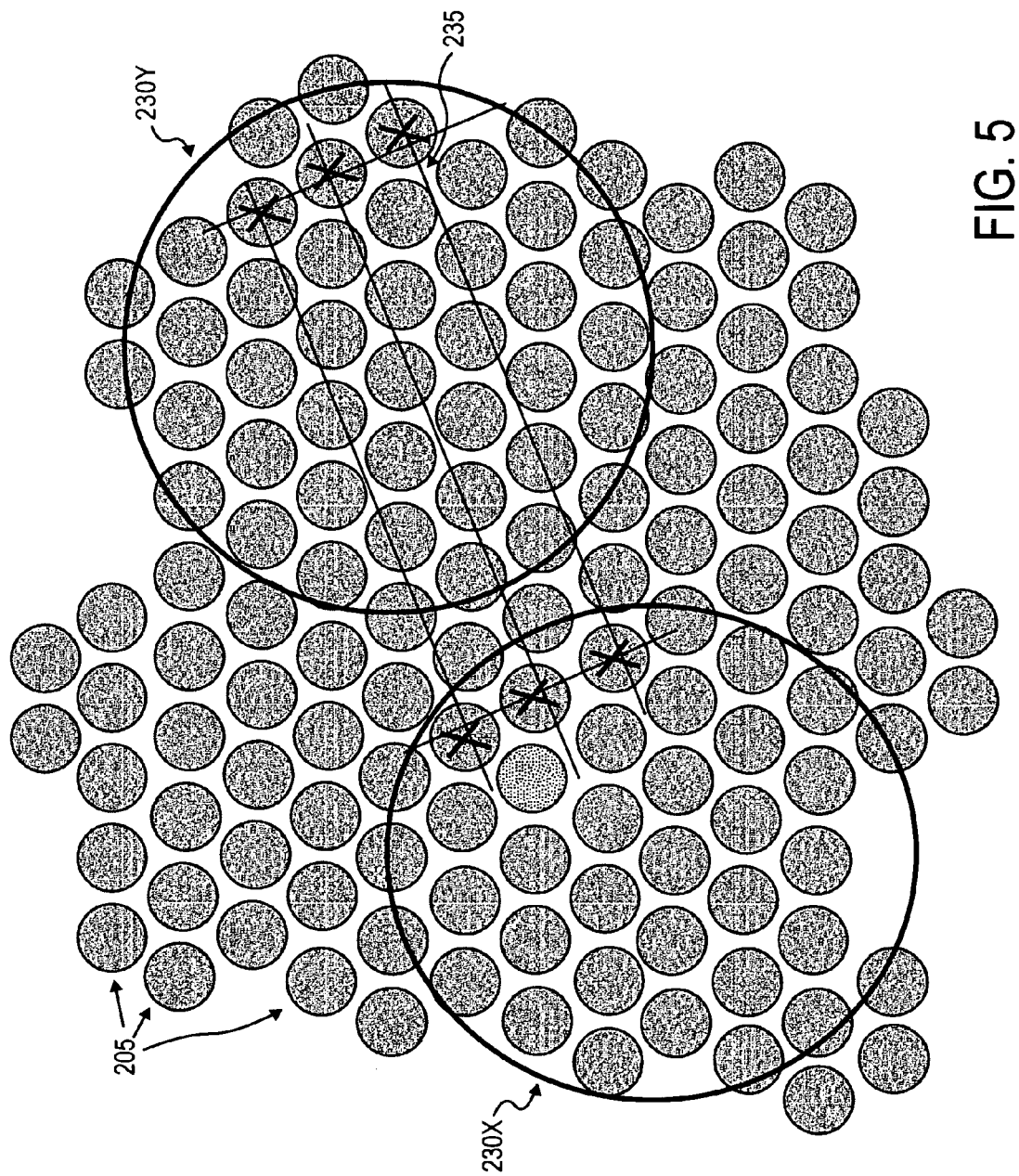
FIG. 5 illustrates an overhead view of an exemplary lenslet array, associated photodetector elements and exemplary compound eye wiring that may be used for the embodiment of FIG. 2.

With the arrangement shown in FIG. 5, for example, light from a particular angle, direction and distance may be directed by individual lenslets 230x and 230y onto each of the corresponding photodetectors 205 marked with an X. As such, each of these photodetectors 205 may be wired together in accordance with the compound eye wiring pattern 235 even though they are not physically adjacent to each other. Thus, in accordance with the compound eye wiring pattern 235, each photodetector element 205 is locally connected to many neighboring photodetector elements as well as being globally connected to many corresponding photodetector elements under different lenslets.

The image integration circuitry 236 of one embodiment includes hybrid analog/digital circuitry such as artificial retina circuitry developed by Carver Mead at the California Institute of Technology. This hybrid digital/analog circuitry acts to interconnect and interpret outputs of the photodetector elements 205 to provide an integrated image at output circuitry 207. The image integration circuitry 236 may provide capabilities such as lateral inhibition for edge enhancement, and/or time differentiation for movement detection, for example. Alternatively, these capabilities may be provided in image processing circuitry (not shown). Other types of image-related capabilities may also be provided by image integration circuitry 236. Examples of such circuitry are described, for example, in a paper entitled, "A Biologically Motivated Imager and Motion Detector With Pixel Level Image Processing," by A. Moini and A. Bouzerdoum, Australian Microelectronics Conference, 29 Sep.–3 Nov., 1997, Melbourne, the text of which can, at the time of this filing, be found at http://www.eleceng.adelaide.edu.au/Groups/GAAS/Bugeye/pub_bug/micro97.pdf Other types of image integration circuitry are within the scope of various embodiments.

For one embodiment, image integration circuitry 236 and any other image processing circuitry included in the compound eye 200 are designed such that, for example, edge enhancement, motion detection and/or pattern recognition can be parallelized and take place concurrently with photoreception.

Referring back to FIG. 2, the compound eye wiring pattern 235 for the entire photosensitive region 206 of the IC 210 may be determined using a number of different approaches. For one embodiment, the compound eye wiring pattern 235 is determined by applying a light source to the compound eye 200 and determining which of the photodetectors 205 is responsive to the incident light. The position of the light source is then varied according to the application for the compound eye 200 until the compound eye wiring pattern 235 is identified.

Alternatively, the compound eye wiring pattern 235 may be determined using mathematical equations similar to equations used to determine the operation of a compound eye of, for example, an insect. Examples of use of such equations are described in, for example a paper entitled, "Silicon Retina with Adaptive Filtering Properties," by Shih Chii Liu, NIPS Proceedings, November 1997, the text of which can presently be located at http://www.pcmp.caltech.edu/anaprose/shih/. Other types of mathematical approaches for determining the compound eye wiring pattern 235 are within the scope of various embodiments.

The compound eye wiring pattern 235 will depend on many factors in addition to the configuration of the lenslet array 115 such as whether the designer wishes, for example, to implement lateral inhibition, whether color or grayscale images are desired, whether movement detection is desired and, if so, what kinds of movement detection are desired, whether the circuit behavior under low light conditions is desired to behave differently than under high light conditions, whether the circuitry needs to consume minimal power, and so on.

Where the lenslet array is not directly fabricated on the IC 210, positioning the lenslet array 215 with respect to the photosensitive region 206 on the IC 210 including the photodetectors 205 may be accomplished in different ways depending on the relative sizes of the lenslets 230, the lenslet array 215, the photosensitive region 206, the compound eye wiring pattern 235, and other factors. For one embodiment, for example, it is only necessary to grossly align the lenslet array 215 over the photosensitive region 206. The compound eye wiring pattern 235 then determines the relative relationship between each of the photodetectors 205 and picture elements of a resulting, corresponding image.

For another embodiment, more precise alignment may be beneficial. For such embodiments, it may be possible to use conventional alignment tools to precisely align particular lenslet(s) 230 over particular photodetector(s) 205. Other approaches to aligning the lenslet array 215 with respect to the IC 210 are within the scope of various embodiments.

With continuing reference to FIG. 2, for one embodiment, the photodetector elements 205 are electrically coupled to integrated and/or off-chip output circuitry 207 such that an image captured by the photodetector elements 205 corresponding to light source 225 may be provided at outputs of the output circuitry 207. The output circuitry 207 may be coupled to, for example, a display device. Alternatively, output circuitry 207 may include a memory device such as a flash memory to store an image captured by the photoreceptor elements 205 in response to light energy. It will be appreciated that other types of circuitry and/or elements such as, for example, a color filter array, an analog to digital converter, shutter control circuitry, and/or additional image processing circuitry that may include such capabilities as, for example, demosaicing, resolution interpolation, subsampling, etc., may also be included, either on the IC 210 itself or may be off-chip and electrically coupled to the IC 210.

In operation, photons from point light sources such as the light source(s) 225 corresponding to the image to be captured strike lenslets 230 of the lenslet array 215. At least some of the lenslets 230 direct the photons to be received by one or more associated photodetector elements 205. The photodetector elements 205 that receive the photons are responsive to the photons to produce an electrical signal at an output of the photodetector element 205, wherein the magnitude of the electrical signal is related to the energy of the incident photons.

Image integration circuitry 236 and other image processing circuitry (not shown) may convert these electrical signals to digital signals and provide other image processing capabilities. The compound eye wiring pattern 235 determines a relationship between the signals provided at outputs of the photodetectors 205 and a resulting image that is provided at outputs of output circuitry 207.

Where the compound eye 200 is a sensor for a PC camera, for example, the output image may be in the form of a digital moving image. Alternatively, where the compound eye 200 is a sensor for a digital still camera, the output image may be in the form of a digital still image. The compound eye 200 may be used for many other types of applications with many other types of corresponding output images. For example, the compound eye 200 may be used for tracking objects, controlling appliances or machinery, monitoring processes, etc.

Figure 6:
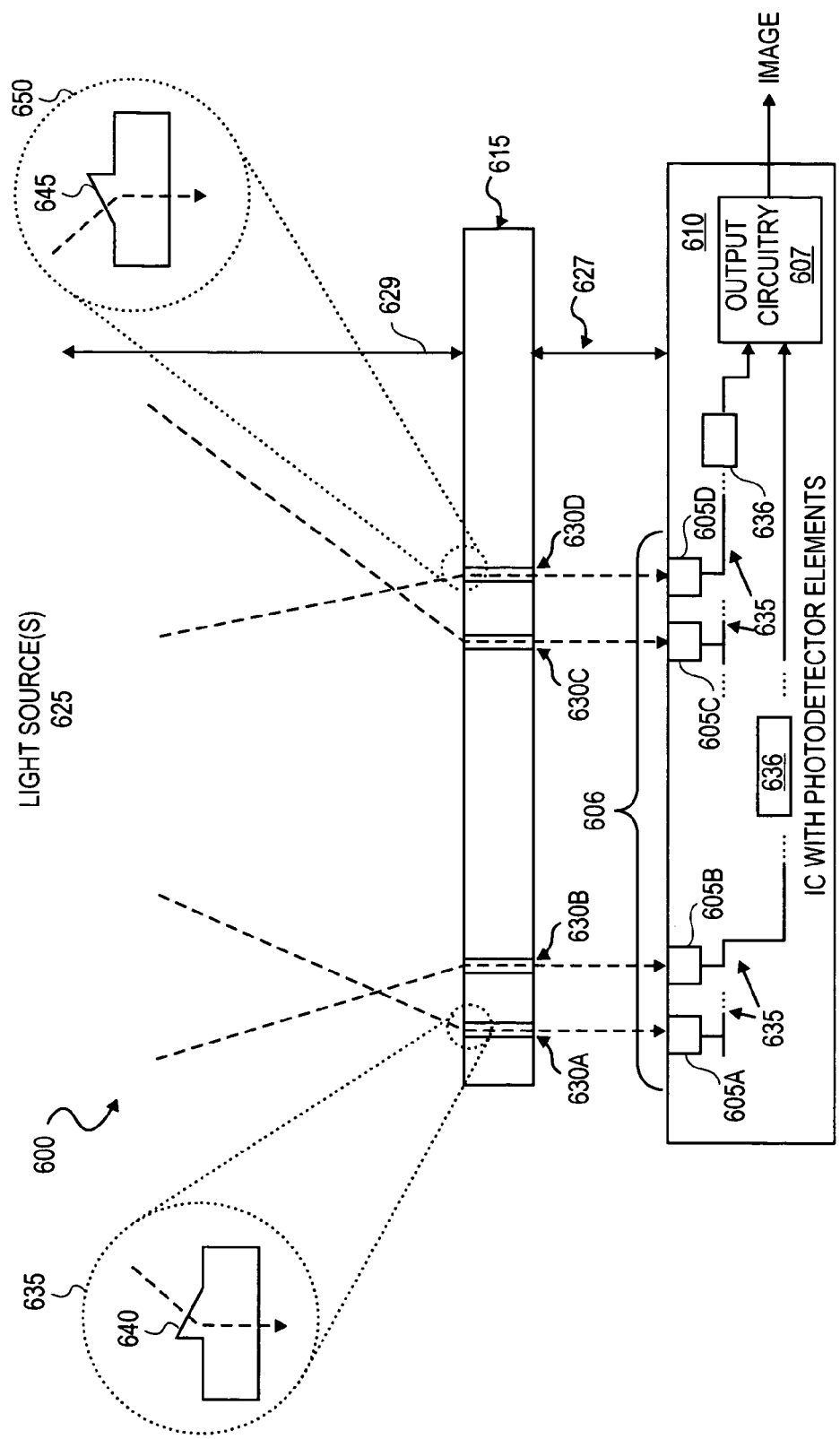
FIG. 6 illustrates a cross-sectional view of an exemplary integrated circuit-based compound eye of another embodiment including a light pipe bundle.

Referring now to FIG. 6, a cross-section of a compound eye 600 in accordance with another embodiment is shown. For the compound eye 600, photodetector elements 605 are disposed on an integrated circuit (IC) or other substrate 610 as described above in reference to FIG. 2 to provide a photosensitive region 606 on the IC 610. The photodetector elements 605 may be similar in function, operation, arrangement, and/or construction to the photodetector elements 205 described in reference to FIG. 2.

For the exemplary compound eye 600, as for the compound eye 200, a compound light directing member 615 is disposed between one or more light sources of interest 625 and photodetector elements 605. In contrast to the compound eye 200 of FIG. 2, for the compound eye 600 of FIG. 6, the light directing member 615 includes a plurality of light pipes 630 bundled together to provide a light pipe array 615, also referred to herein as a light pipe bundle.

Figure 7:
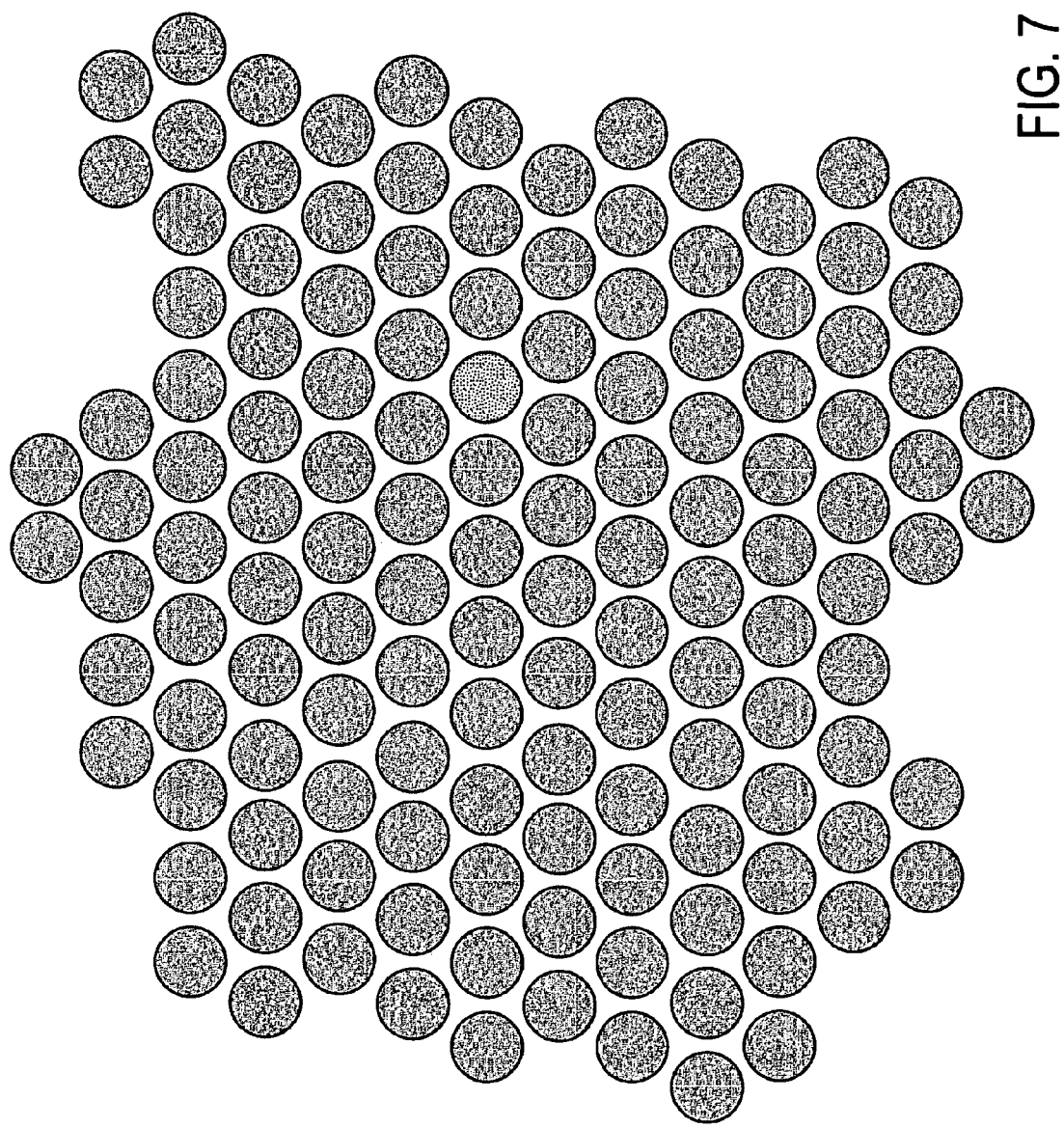
FIG. 7 illustrates an overhead view of a light pipe array that may be used for the embodiment of FIG. 6.

FIG. 7 is an overhead view showing an exemplary arrangement of such a light pipe array 615, although a different number of light pipes and/or a different light pipe arrangement may be used for various embodiments. For some embodiments, the arrangement, spacing, diameters, etc of the light pipes 630 may depend on factors similar to those considered for the lenslet array 215.

Referring back to FIG. 6, each of the light pipes 630, like the lenslets 230 of FIG. 2, acts as a light directing element, wherein at least some of the light pipes 630 direct light to be received by one or more corresponding photodetector elements 605. Exemplary light pipes 630a–630d are shown in FIG. 6, but it will be appreciated that the light pipe bundle 615 may include many more such light pipes 630.

Figure 8:
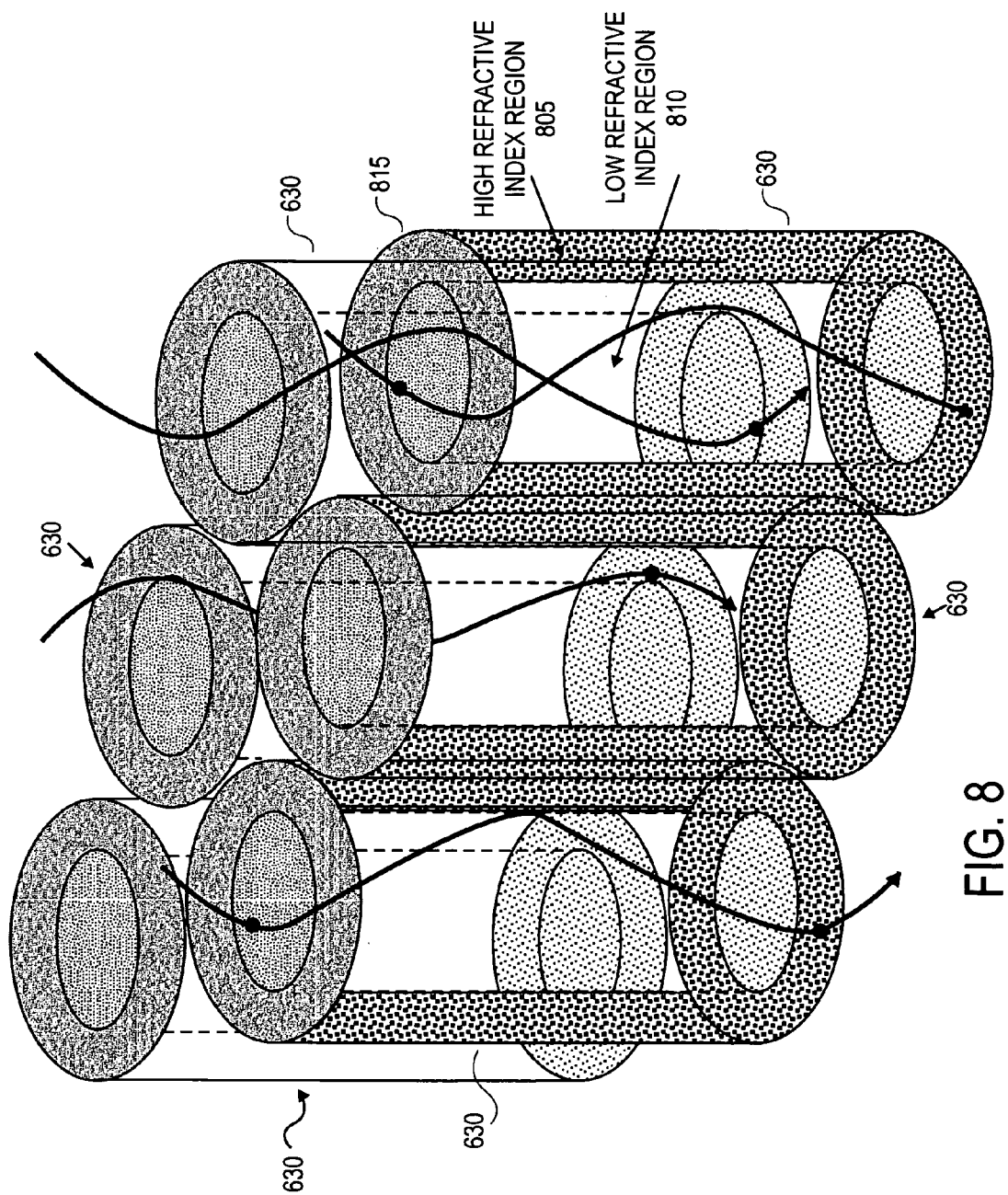
FIG. 8 shows additional detail of some exemplary light pipes that may be used for the embodiment of FIG. 6.

FIG. 8 shows a few exemplary light pipes 630 in more detail. As shown in FIG. 8, the light pipes 630, also referred to as optical fibers, each comprise a higher refractive index region 805 and a lower refractive index region 810. Because the fibers 630 are clad with material of higher refractive index than their cores 810, photons incident on one end of a fiber 630 are directed down the fiber 630 and to underlying photodetectors 605. If external ends 815 of the light pipes 630 are planar, photons entering at an angle normal to the plane of the external end 815 are preferentially conducted down the light pipe 630.

The higher refractive index region 805 causes a portion of the light that enters the light pipe 630 at an angle to be reflected as shown. Thus, only a portion of the light that enters each light pipe 630 is directed to an underlying or otherwise associated photodetector 605. So, because of their construction, light pipes 630 may have a smaller angular response than the lenslets 230 described above, i.e. light that is passed through the light pipes 630 may need to be closer to perpendicular to a surface 815 of the light pipe 630 that initially receives the light. The above factors may result in reduced efficiency of the compound eye 600 as compared to the compound eye 200 of FIG. 2 in terms of light capture.

For one embodiment, however, the compound eye 600 of FIG. 6 may provide more flexibility than the compound eye 200 of FIG. 2 in an optical sense. This is because the optics of the lenslet-based eye 200 places more constraints on the underlying integration circuitry (i.e. compound eye wiring pattern and image integration circuitry) as compared to the compound eye 600 of FIG. 6. For the compound eye 200 of FIG. 2 of one embodiment, for example, there is a one lenslet 230 to many photodetector element 205 mapping while for the compound eye 600 of FIG. 6, the mapping of light pipes 630 to photodetector elements 605 may be closer to one-to-one.

Also, for the light pipes 630, for one embodiment, referring to FIGS. 6 and 8, the external surfaces 815 of the light pipes 630, i.e. the surfaces that initially receive photons from one or more light sources of interest 625, can be cut or otherwise altered to vary the angle of the external surface. The angles of the external surfaces 815 determine at which point sources of light and/or at which combination of point sources each particular light pipe 630 is aimed.

Referring to FIG. 6, for example, as shown in the exploded view 635, the light pipe 630a may have an external surface 640 cut at the angle shown to preferentially receive light from one direction while the light pipe 630d may have an external surface 645 cut at the angle shown in exploded view 650 to preferentially receive light from another direction.

Thus, the external surfaces of the light pipes 630 may all be at the same angle with respect to each other or they may have different angles with respect to each other depending on the particular application and desired characteristics of the resultant compound eye 600. In this manner, the compound eye 600 may provide improved flexibility in terms of designing the spatial sensitivity of the eye 600.

The light pipe bundle 615 of one embodiment may be manufactured in a variety of different ways in accordance with known technology. Some exemplary light pipe bundles that may be suitable to provide the light pipe bundle 615 are provided by Schott Fiber Optics of Southbridge, Mass., a division of Schott Corporation of Yonkers, N.Y. In particular, light pipe bundles similar to Schott's fused fiber optic faceplates may be used to provide the light pipe bundle 615. Alternative approaches to manufacturing a suitable light pipe bundle are within the scope of various embodiments.

With continuing reference to FIG. 6, the compound light directing member 615 may be optically coupled with the photodetector elements 605 by including the compound light directing member 615 as an optical window in a package for the IC device 610, for example. For another embodiment, the compound light directing member 615 may be optically coupled with at least some of the photodetector elements 605 in another manner. For one embodiment, the light directing member 615 is only grossly aligned with the photosensitive region provided by photodetector elements 605 and the relationship of the photodetector elements 605 to the light pipe array 615 is determined after manufacturing. For another embodiment, more precise alignment may be desirable in which case, commercially available alignment machinery may be used.

For one embodiment, a distance 627 between the light directing member 615 and a surface of the IC 610 may be less than or equal to 0.0001 meter, for example, while a distance between the light directing member and a light source of interest may be greater than or equal to 0.1 meter. It will be appreciated that either of the above distances may be different for other embodiments. For example, for one embodiment, the light directing member 615 may be placed in direct contact with a surface of the substrate 610 including the photodetectors 605.

As for the compound eye 200, to integrate an image corresponding to the one or more light sources of interest 625 at output circuitry 607, outputs of the photodetector elements 605 of the compound eye 600 are wired together using a compound eye wiring pattern 635 and image integration circuitry 636. According to the compound eye wiring pattern 635, photodetectors 605 that are physically adjacent to each other on the substrate 610 may not necessarily provide portions of a captured image that are physically adjacent to each other.

The image integration circuitry 636 of one embodiment may be similar in function, capabilities and/or construction to the image integration circuitry 236 of FIG. 2.

Due to the different mappings of light directing elements 630 to photoreceptors 605 for the compound eye 600 as compared to the compound eye 200, the compound eye wiring pattern 635 may differ from the compound eye wiring pattern 235. The compound eye wiring pattern 635, however, may be determined in a similar manner to the compound eye wiring pattern 235 to provide an integrated output image at output circuitry 607 that corresponds to one or more light sources of interest 625.

It should be noted that, whatever mapping maps point sources of light in the environment 635, 650 of FIG. 6 to particular receptors 605, the mapping could be studied and more fully characterized after manufacture by moving point sources of light across the "visual field" of the device and recording its output 607. This kind of post-hoc mapping, however, is not necessarily useful for designs for which circuits are based on particular geometric relationships such as lateral inhibition. For these cases, the mapping should preferably be implemented in the manufacturing process.

In operation, photons from point light source(s) 625 corresponding to the image to be captured are received at at least some of the light pipes 630. At least some of the light pipes 630 direct photons to be received by one or more corresponding photodetector elements 605, which are each responsive to the photons to produce an electrical signal at an output that is related in magnitude to the energy of the incident photon.

Image integration circuitry 636 and, for some embodiments, other image processing circuitry (not shown) may convert these electrical signals to digital signals and provide other image processing capabilities. The compound eye wiring pattern 635 determines a relationship between the signals provided at outputs of the photodetectors 605 and a resulting image provided at outputs of output circuitry 607.

As for the compound eye 200, the form of the output image may depend on the particular application for the compound eye 600. Further, the compound eye 600 may be used for any number of image sensing applications including, for example, tracking objects, controlling machinery or appliances, camera applications, etc.

Figure 9:
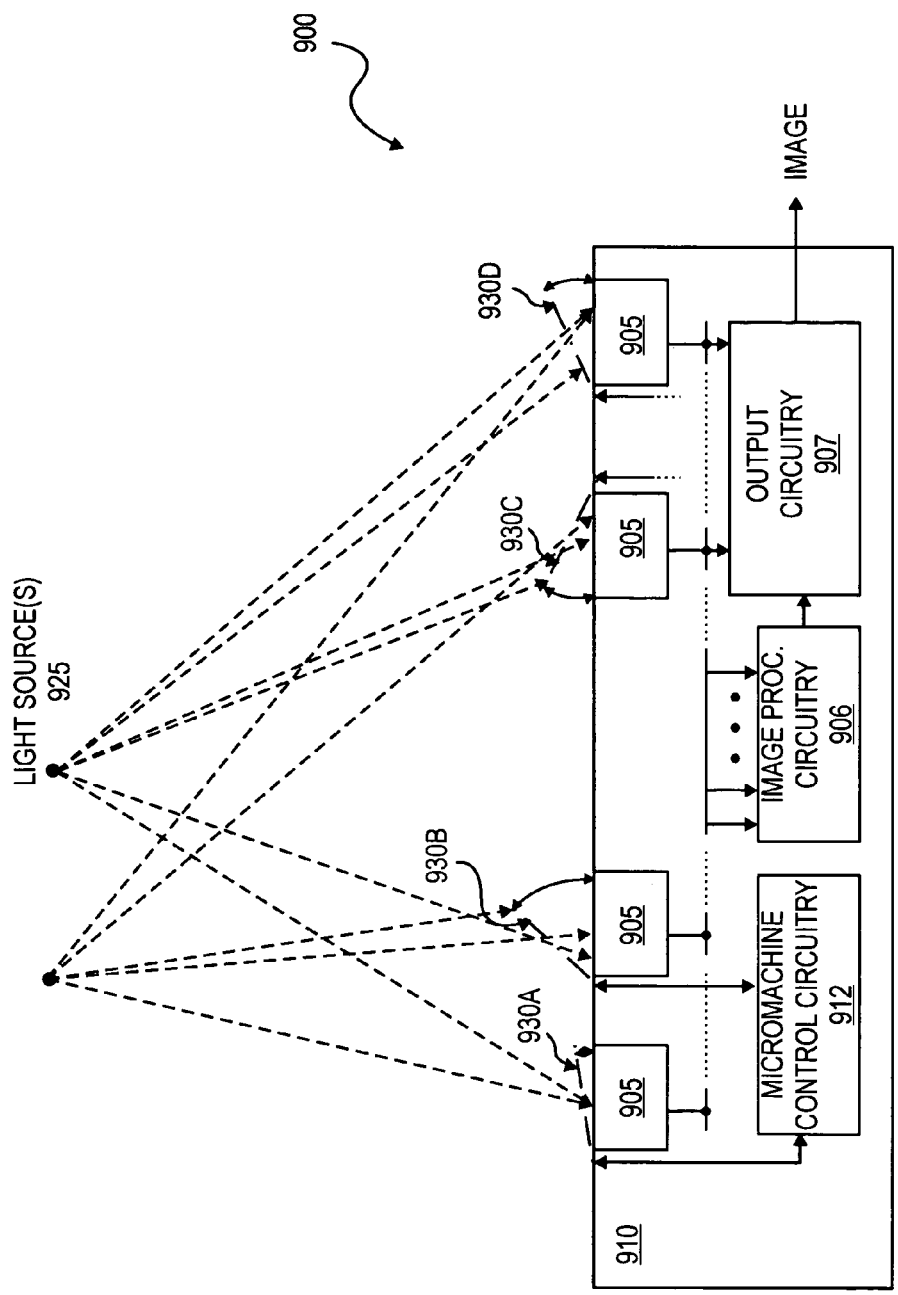
FIG. 9 illustrates a cross-sectional view of an exemplary integrated circuit-based compound eye of another embodiment including micromachined light directing elements.

FIG. 9 is a cross-sectional view of a compound eye 900 of another embodiment. For the compound eye 900, photodetectors 905 are provided on a semiconductor or other type of substrate 910. The photodetectors 905 and/or the substrate 910 may be similar in construction, characteristics and/or operation to the photodetectors 205 and/or the photodetectors 605 of FIGS. 2 and 6, respectively.

Figure 10:
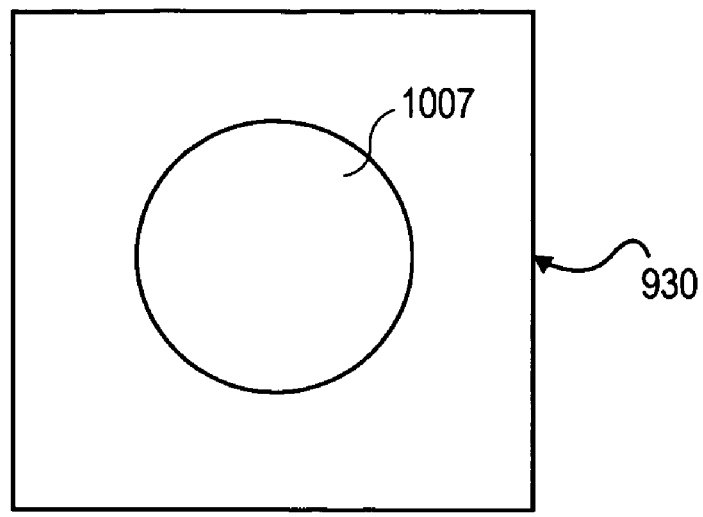
FIG. 10 illustrates an overhead view of an exemplary micromachined light directing element of the embodiment of FIG. 9.

The compound eye 900 also includes light directing elements 930. For the embodiment shown in FIG. 9, the light directing elements 930 comprise micromachined light directing elements, each of which has an opening 1007 as shown in FIG. 10 to allow light to pass through and be received by underlying photodetector(s) 905. While the opening 1007 is round in FIG. 10, it will be appreciated that the opening may be a different shape for other embodiments.

Only a representative few micromachined elements 930*a–d* are shown in FIG. 9, however, it will be appreciated that any number of micromachined elements may be operatively coupled to substrate 910 in, for example, a two dimensional array or other arrangement. Further, while FIG. 9 illustrates an embodiment for which there is a one-to-one correspondence between micromachined light directing elements 930 and photodetector elements 905, for other embodiments, more than one photodetector element 930 may underlie a single micromachined element or vice versa.

For one embodiment, the micromachined light directing elements 930 are each individually controlled by micromachine control circuitry 912 to vary the angle of the light directing element 930 with respect to a surface of the substrate 910. In this manner, the position of the opening 1007 in each of the micromachined light directing elements 930 is varied relative to the underlying photodetector(s) 905 and the light source(s) of interest 925. Varying the relative position of the openings 1007 in the light directing members 930 determines which point sources of light 925 and which combinations of point sources provide photons that are received at each individual photodetector element 905.

For other embodiments, groups of light directing elements 930 may be controlled together to operate in a similar manner to each other. In this manner, the compound eye 900 may actually operate as multiple compound eyes to capture multiple individual images concurrently.

While the angles of each of the micromachined light directing elements 930*a–d* of FIG. 9 vary in one of two directions, it will be appreciated that the compound eye 900 may include micromachined light directing elements that vary in any direction in response to control signals received from the micromachine control circuitry 912.

The micromachined light directing elements 930 of one embodiment are manufactured on the substrate 910 in accordance with techniques used to manufacture, for example, micro mirror switches and/or digital mirror devices. Examples of such techniques are described in, for example, a paper entitled, "Micromachined Adaptive Mirrors," by Gleb Vdovin of the Laboratory of Electronic Instrumentation, Delft University of Technology. The paper can presently be found at http://guernsey.et.tudelft.nl/tyson4/.

Such devices, however, typically do not include an opening such as the opening 1007. Thus, in addition to the known techniques for manufacturing micromachined elements, an additional processing action of providing an opening in the micromachined light directing element is provided.

Techniques for designing micromachine control circuitry similar in many respects to the micromachine control circuitry 912 to individually control each of the micromachined elements are also known to those of ordinary skill in the art and implemented in, for example, digital mirror devices manufactured by Texas Instruments. The control circuitry 912 may differ in some respects from such circuitry, however, depending on the particular application for the compound eye 900.

Outputs of photodetector devices 905 are coupled to image processing circuitry 906 and/or to output circuitry 907 to provide a synthesized image corresponding to light source(s) 925. Image processing circuitry and output circuitry 907 may each provide capabilities similar to corresponding circuitry described in reference to other embodiments and may be configured in a similar manner.

More specifically, depending on the application for the compound eye 900, the image processing circuitry 906 may include a variety of different types of circuitry. For example, for some embodiments, such as where the micromachine control circuitry 912 controls the light directing elements 930 such that the compound eye 900 actually operates as two distinct eyes, the image processing circuitry 906 may include edge enhancement circuitry, lateral inhibition circuitry, etc. For other embodiments, such as, for example, where it is desirable to be able to move any receptor's local visual field to any place in the entire visual field independently of other receptor fields, the image processing circuitry 906 and/or output circuitry 907 may be off-chip and may not include the above-described capabilities.

In operation, light from light source(s) 925 is radiated towards the compound eye 900. Micromachine control circuitry 912 controls the angle of each of the micromachined light directing elements 930 with respect to a surface of the integrated circuit 910 by, in a manner well-known to those of skill in the micromachine arts. The particular angle of each of the micromachined light directing elements 930 determines from which point source(s) 925 photons are received at each photodetector element 905.

Energy from photons received at each photodetector element 905 is converted to a corresponding electrical signal at outputs of each of the photodetector elements 905 which are interconnected and coupled with output circuitry 907 in such a way so as to provide an image corresponding to light source(s) 925 at an output.

Micromachine control circuitry 912 may dynamically vary the angles of one or more of the micromachined light directing elements 930 in response to user input, a particular software program, feedback circuitry, a state machine or other types of input stimuli. The manner in which the light directing elements 930 are controlled may depend on the particular application for the compound eye 900. For example, the compound eye 900 may provide a tracking mechanism to track movement of an object, however, other applications for compound eye 900 will be appreciated by those of ordinary skill in the art.

Figure 11:
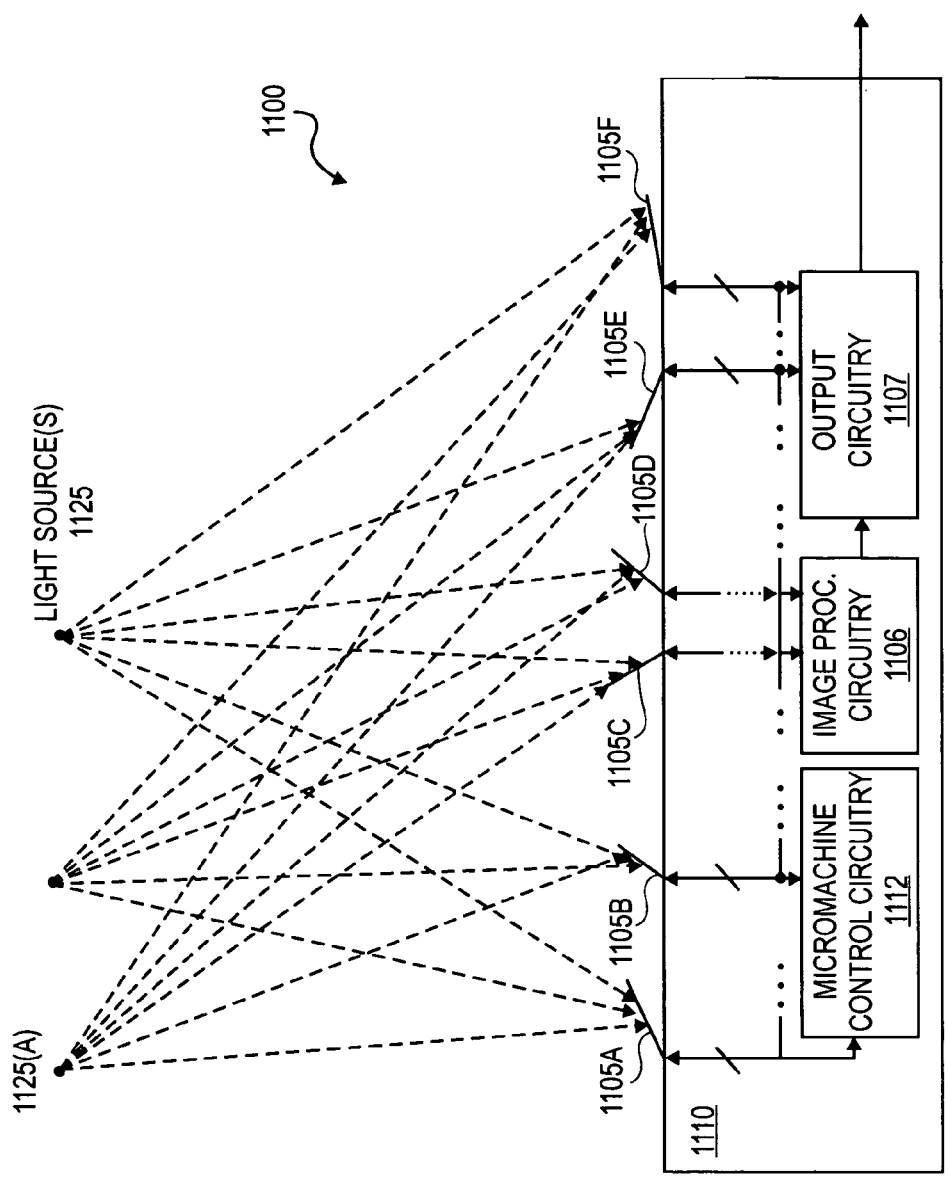
FIG. 11 illustrates a cross-sectional view of an exemplary integrated circuit-based compound eye of another embodiment including micromachined light scanning elements with integrated photodetector elements.

FIG. 11 is a cross-sectional view of a compound eye 1100 of another embodiment. The compound eye 1100 includes micromachined light directing elements 1 105, each of which includes an integrated photodetector element. The light directing elements 1105 are referred to herein as light scanning elements due to the fact that angle of the photodetector itself is adjusted by these elements to determine the point source(s) and/or angles from which light energy is received as described in more detail below.

Figure 12:
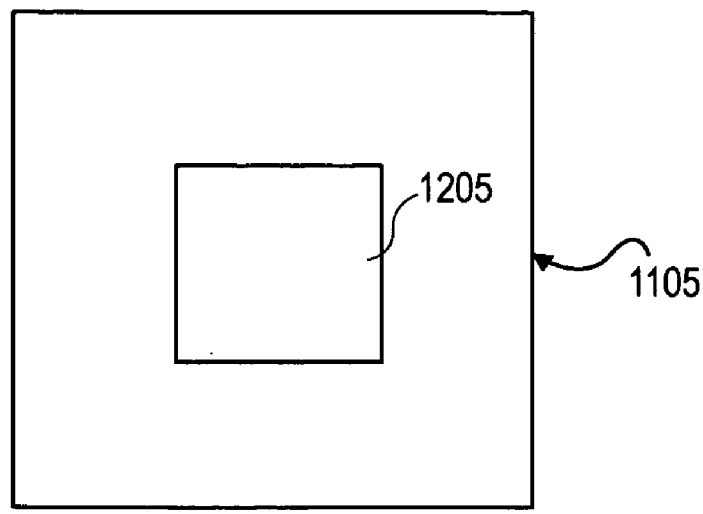
FIG. 12 illustrates an overhead view of a micromachined light scanning element of the embodiment shown in FIG. 11.

FIG. 12 is an overhead view of such a micromachined light scanning element 1105 and corresponding photodetector element 1205. The photodetector elements 1205 may be similar in construction, operation and/or other characteristics to photodetector elements of one or more of the other embodiments described herein.

The compound eye 1100 also includes micromachine control circuitry 1112 and may include on-chip output circuitry 1107. The micromachine control circuitry 1112 may be configured in a similar manner to the micromachine control circuitry 912 of FIG. 9 to vary the angles of micromachined light scanning elements 1105. Only a representative few light scanning elements 1105a–f are shown in FIG. 11, each of which varies in only one of two directions. It will be appreciated, however, that the compound eye 1100 may include many more such micromachined light scanning elements, each of which may vary in directions relative to the substrate 1110 other than those shown.

The micromachined light scanning elements 1105 may be manufactured in a manner similar to the light directing elements for the compound eye of FIG. 9, with some modifications. For the micromachined light scanning elements 1105, for example, an opening is not provided. Further, each of the micromachined light scanning elements 1105 is fabricated to include a photodetector element 1205 as described above and to provide an output signal from the photodetector element to image processing circuitry 1106 and/or output circuitry 1107.

In operation, the angle of each of the micromachined light scanning elements 1105 with integrated photodetector element 1205 is determined in response to micromachine control circuitry 1112. Micromachine control circuitry 1112 may be responsive to user input, software instructions, state machine circuitry, other control circuitry, etc. to determine the angles of each of the integrated light scanning elements 1105.

The angle of each of the individual light scanning elements 1105 determines from which point source(s) 1125 and at what angle light is received. For example, light from the point source 1125a is blocked from being received by the photodetector on the scanning element 1105c, but may be received by the remaining photodetectors on the scanning elements shown. Photons received by each of the photodetector elements 1205 cause a corresponding electrical signal to be produced at an output of the photodetector element 1205 that is provided to image processing circuitry 1106 or to output circuitry 1107, depending on the application.

The image processing circuitry 1106 and/or output circuitry 1107 may be similar in configuration and/or operation to the corresponding circuitry described above in reference to FIG. 9. The image processing circuitry 1106 and/or 1107 integrates the output information from photodetector elements 1205 to synthesize one or more images captured by the eye 1100.

Either of the integrated circuit based compound eyes 900 or 1100 may be used for a variety of unique applications as well as for other applications mentioned in reference to the compound eyes of other embodiments. For example, for one embodiment, one of the compound eyes 900 or 1100 could dynamically be broken into multiple eyes, each capable of tracking an individual object for a given time period. This eye could then be dynamically reconfigured to operate as a single eye for another purpose. Other applications which may benefit from the capability to individually reposition the light scanning or directing elements and/or to capture multiple individual images simultaneously may also be a good target application for the compound eyes 900 and/or 1100.

Each of the above-described embodiments provides an integrated circuit-based compound eye including a synthetic aperture that is capable of being used for a variety of image sensing and/or processing applications. The integrated circuit-based compound eyes of various embodiments provide image sensing chips that do not require external lenses and thus, may provide a substantial cost savings over conventional image sensors with similar capabilities. Further, because the compound eyes of various embodiments do not require an external lens, they are substantially planar and scale well to small form factors and weights.

The applications for such integrated circuit-based compound eyes are innumerable. Video technologies, digital photography applications, graphics arts, video recognition, rugged optical sensors, etc. may all benefit from such an artificial compound eye.

Other features and advantages of the integrated circuit-based compound eye of various embodiments will be appreciated by those of ordinary skill in the art.

Figure 13:
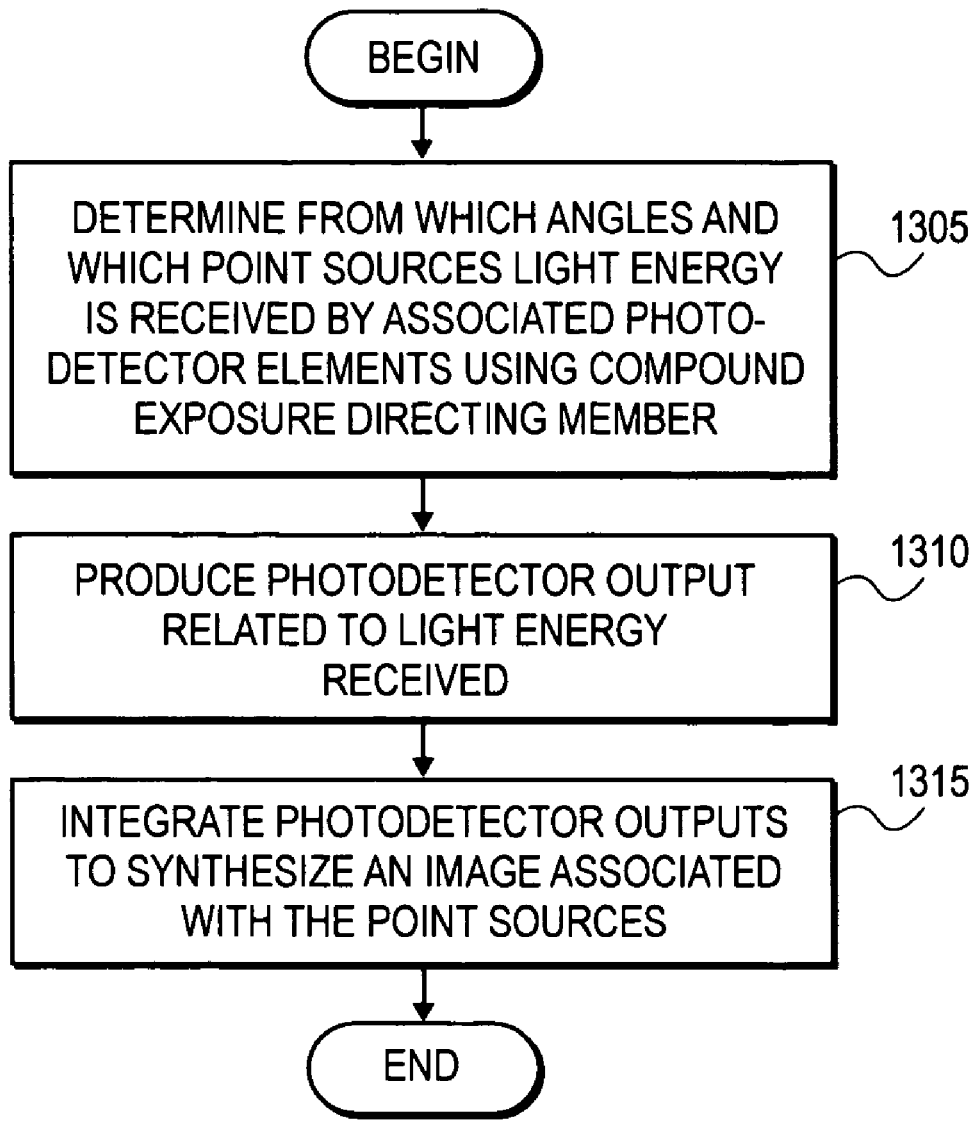
FIG. 13 is a flow diagram illustrating the method of one embodiment for image sensing using an integrated circuit-based compound eye.

FIG. 13 is a flow diagram showing the image capture method of one embodiment. At block 1305, it is determined from which angles and/or which point sources light energy is directed to associated photodetector elements. The photodetector elements produce an output that is related to the light energy received at block 1310 and at block 1315, the outputs of the photodetector elements are integrated to synthesize an image associated with the point sources.

It will be appreciated that the method of other embodiments may include additional actions not shown in FIG. 13.

Thus, various embodiments of an integrated circuit-based compound eye are described. In the foregoing specification, the invention has been described with reference to specific exemplary embodiments thereof. It will, however, be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus comprising:
   a plurality of photodetector elements disposed on a semiconductor substrate; and
   a compound light directing member comprising a light pipe bundle, at least some of the light pipes to individually direct light energy from one or more sources onto one or more of the photodetector elements,
   outputs of the photodetector elements being electrically coupled using a compound eye wiring pattern such that an image associated with one or more sources is synthesized at output circuitry, the compound eye wiring pattern to interconnect at least two photodetector elements that are not adjacent to each other to provide adjacent pixels of the image, the photodetector elements and compound light directing member together comprising a substantially planar artificial compound eye.

2. The apparatus of claim 1 wherein the light pipe bundle includes first and second light pipes, the first light pipe having an external surface that is at a first angle relative to the substrate to preferentially receive light from a first direction, the second light pipe having an external surface that is at a second angle relative to the substrate to preferentially receive light from a second direction, the first and second angles and first and second directions being different from each other.

3. The apparatus of claim 1 wherein
   a distance between the plurality of photodetector elements and the compound light directing member is less than or equal to 0.0001 meter, and
   wherein a distance between the compound light directing member and the one or more sources is greater than or equal to 0.1 meter.

4. The apparatus of claim 3 wherein the compound light directing member provides an optical window in an integrated circuit package including the plurality of photodetector elements.

5. An apparatus comprising:
   a light directing member including a plurality of fiber optic elements; and
   an array of photodetector elements disposed on a single integrated circuit device, a set of the photodetector elements being coupled to receive light energy from a source via one or more of the fiber optic elements, the set of the photodetector elements being wired using a compound eye wiring pattern to produce an image corresponding to the source at output circuitry to be coupled to the set of the photodetector elements, the compound eye wiring pattern to interconnect at least two photodetector elements that are not adjacent to each other to provide adjacent pixels of the image,
   wherein the light directing member and the single integrated circuit device together provide a substantially planar, artificial, compound eye.

6. The apparatus of claim 5 wherein
   a distance between the plurality of photodetector elements and the light directing member is less than or equal to 0.0001 meter, and
   wherein a distance between the light directing member and the source is greater than or equal to 0.1 meter.

7. The apparatus of claim 6 wherein
   the light directing member provides an optical window in an integrated circuit package including the array of photodetector elements.

* * * * *